United States Patent
Eickhoff et al.

(10) Patent No.: US 11,441,825 B2
(45) Date of Patent: Sep. 13, 2022

(54) NANO-POROUS BASED THERMAL ENCLOSURE WITH HEAT REMOVAL

(71) Applicant: Honeywell International Inc., Morris Plains, NJ (US)

(72) Inventors: Steven J. Eickhoff, Brooklyn Park, MN (US); Paul Bryant Koeneman, Minnetonka, MN (US); Jeffrey Michael Klein, Minneapolis, MN (US); Wei Yang, Minnetonka, MN (US); Jong Park, Plymouth, MN (US); Gustav Rustan, Minneapolis, MN (US)

(73) Assignee: Honeywell International Inc., Charlotte, NC (US)

( * ) Notice: Subject to any disclaimer, the term of this patent is extended or adjusted under 35 U.S.C. 154(b) by 191 days.

(21) Appl. No.: 16/740,159

(22) Filed: Jan. 10, 2020

(65) Prior Publication Data

US 2020/0224939 A1  Jul. 16, 2020

Related U.S. Application Data (60) Provisional application No. 62/791,574, filed on Jan. 11, 2019.

(51) Int. Cl.
| | |
|---|---|
| *F25B 30/02* | (2006.01) |
| *H01M 8/04007* | (2016.01) |
| *H05K 7/20* | (2006.01) |
| *F04D 29/32* | (2006.01) |

(52) U.S. Cl.
CPC ............ *F25B 30/02* (2013.01); *F04D 29/321* (2013.01); *H01M 8/04059* (2013.01); *H05K 7/20309* (2013.01); *H05K 7/20318* (2013.01); *H05K 7/20327* (2013.01); *H01M 2250/30* (2013.01)

(58) Field of Classification Search
CPC .......... H01M 8/04059; H01M 2250/30; Y02E 60/50; H05K 7/2029; F25B 2400/15
See application file for complete search history.

(56) References Cited

U.S. PATENT DOCUMENTS

| | | | |
|---|---|---|---|
| 6,497,110 B2 * | 12/2002 | Davidson | ................. F25B 17/08 257/E23.088 |
| 6,828,675 B2 * | 12/2004 | Memory | ............ H05K 7/20681 165/104.33 |
| 8,641,979 B2 * | 2/2014 | Endo | ................... H01M 8/2475 422/202 |

(Continued)

OTHER PUBLICATIONS

"Request for (RFI): Portable Electronic Cooling (PEC)—IARPA-RFI-19-02", [online]. Retrieved from the Internet: <URL: https://www.iarpa.gov/images/files/rfi/IARPA-RFI-19-02.pdf>, (Nov. 30, 2018), 4 pgs.

(Continued)

*Primary Examiner* — Lionel Nouketcha
(74) *Attorney, Agent, or Firm* — Schwegman Lundberg & Woessner, P.A.

(57) ABSTRACT

A cooling system includes a dual plate structure having a porous material disposed between the plates such that the porous material is sealed from ambient at a pressure less than ambient. A cooling device is thermally coupled to a mobile device supported by the structure and actively removes heat from the mobile device.

19 Claims, 6 Drawing Sheets

(56) References Cited

U.S. PATENT DOCUMENTS

| | | | | |
|---|---|---|---|---|
| 2009/0081022 | A1* | 3/2009 | Yang | F04D 17/127 |
| | | | | 415/89 |
| 2010/0062298 | A1* | 3/2010 | Valensa | H01M 8/2484 |
| | | | | 429/425 |
| 2016/0330873 | A1* | 11/2016 | Farshchian | G06F 1/20 |
| 2017/0105313 | A1* | 4/2017 | Shedd | H05K 7/20309 |
| 2017/0297001 | A1* | 10/2017 | Jung | B32B 27/34 |

OTHER PUBLICATIONS

Abe, Hiroya, et al., "Dry Powder Processing of Fibrous Fumed Silica Compacts for Thermal Insulation", Am. Ceram. Soc., 88(5), (2005), 1359-1361.

Alama, M., et al., "Experimental characterisation and evaluation of the thermo-physical properties of expanded perlite—fumed silica composite for effective vacuum insulation panel (VIP) core", Energy and Buildings, 69, (2014), 1-24.

Atkinson, Ward, et al., "The heat is on: Don't leave your chocolate candy, kids or pets in a parked car", SAE Interior Climate Control Standards Committee, (May 13, 2015), 1-13.

Davraz, Metin, et al., "Performance properties of vacuum insulation panels produced with various filling materials", Science and Engineering of Composite Materials, 21(4), (2014), 7 pgs.

Yoldas, Bulent E., et al., "Deposition of optically transparent IR reflective coatings on glass", Applied Optics, 23(20), (1984), 3638-3643.

\* cited by examiner

NANO-POROUS BASED THERMAL ENCLOSURE WITH HEAT REMOVAL

RELATED APPLICATION

This application claims priority to U.S. Provisional Application Ser. No. 62/791,574 (entitled Nano-Porous Based Thermal Enclosure With Heat Removal, filed Jan. 11, 2019) which is incorporated herein by reference.

BACKGROUND

The use of portable electronic device such smartphones for their intrinsic capabilities (processing, data streaming, GPS) and as processors for other compact sensors can place a significant thermal burden on the smartphone's electronics, especially when the phone is operated under challenging ambient conditions, such as inside of a stationary vehicle without climate control. According to Society of Automotive Engineers publications, when temperatures outside range from 80° to 100° Fahrenheit, the temperature inside a car parked in direct sunlight can quickly climb to between 114° to 170° degrees Fahrenheit.

The internal temperature of a smartphone under steady use can be significantly hotter than the ambient temperature. A phone used as a processor for a vehicle mounted sensor would quite likely be in use in a parked car. Additionally, even if a smartphone is powered off and simply stored in a hot vehicle, irreversible battery damage is likely at temperatures over 120° Fahrenheit, and at temperatures approaching 170° Fahrenheit the battery may rupture, catch fire, or even explode, leading to destruction of the phone, associated sensors, and even the vehicle.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Both the processing power available and the number of sensors that are available in, or linkable to, smartphones has increased exponentially in recent years. Today, smartphones can be commercially obtained with built-in capability to function as microphones, cameras, proximity sensors, ambient light sensors, motion sensors, gyroscopes, accelerometers, magnetometers (digital compasses), thermometers, humidity sensors, barometers, heart rate monitors, pulse oximeters, laser range finders, barcode scanners, and Geiger counters. Plug-in or wireless attachments for smartphones are commercially available that convert the devices into anemometers, temperature probes, digital stethoscopes, electrocardiograms (EKGs) and Fourier Transform Infrared Spectrometers (FTIRs), among others.

Additionally, the intrinsic connectivity, processing power, and proliferation of specialized apps and smartphone compatible software makes smartphones excellent candidates to use as components of distributed and mobile sensing networks of many kinds. For example, the Defense Advanced Research Projects Activity (DARPA) SIGMA program has demonstrated a distributed network of handheld and vehicle-based radiation detectors that uses in part cell phone processing and connectivity to produce a scalable network system for continuous, real-time nuclear and radiological threat monitoring.

Various embodiments of the present inventive subject matter include a device that operates as a cooling device for heat generating battery powered mobile devices, such as smart phones. Different embodiments provide cooling solutions that both mitigate the internal heat load from the device's electronics under heavy use conditions and shield the device from high ambient temperatures, such as up to 170° Fahrenheit. Various approaches described herein utilize power supplied within a form factor of a cooling device, or a passive approach, neither of which tap into the device's battery.

The hardware for mobile electronic devices has come a long way towards more power efficient computing that works for most environments, but when mobile devices are put in extreme conditions and/or given a heavy workload, they still need some help with their thermal management.

Under conditions typically encountered in a vehicle, such as a car, during a warm sunny day, the overall heat load is very high—as much as 30 W, dominated by the conductive load between the car surface and the device. Under these assumptions, solving a thermal problem of keeping the mobile electronic device at 50° C. or lower may be difficult with a reasonably-sized cooling form factor. This scenario is worst-case, in that the thermal mass of the car would prevent the immediate temperature of the interior surfaces from matching the air temperature.

In the following description, two different methods are described. First described, a passive method involves the use of a nano-porous material that is maintained in a sealed vacuum between two plates, forming a thermal insulator. The plates may be formed as an enclosure using a first passive cooling method. Next described is an active cooling method wherein the plates may be formed as a container, such as a cradle, in which the mobile device may be easily placed. An active heat removal mechanism is powered independently from the mobile device.

Figure 1:
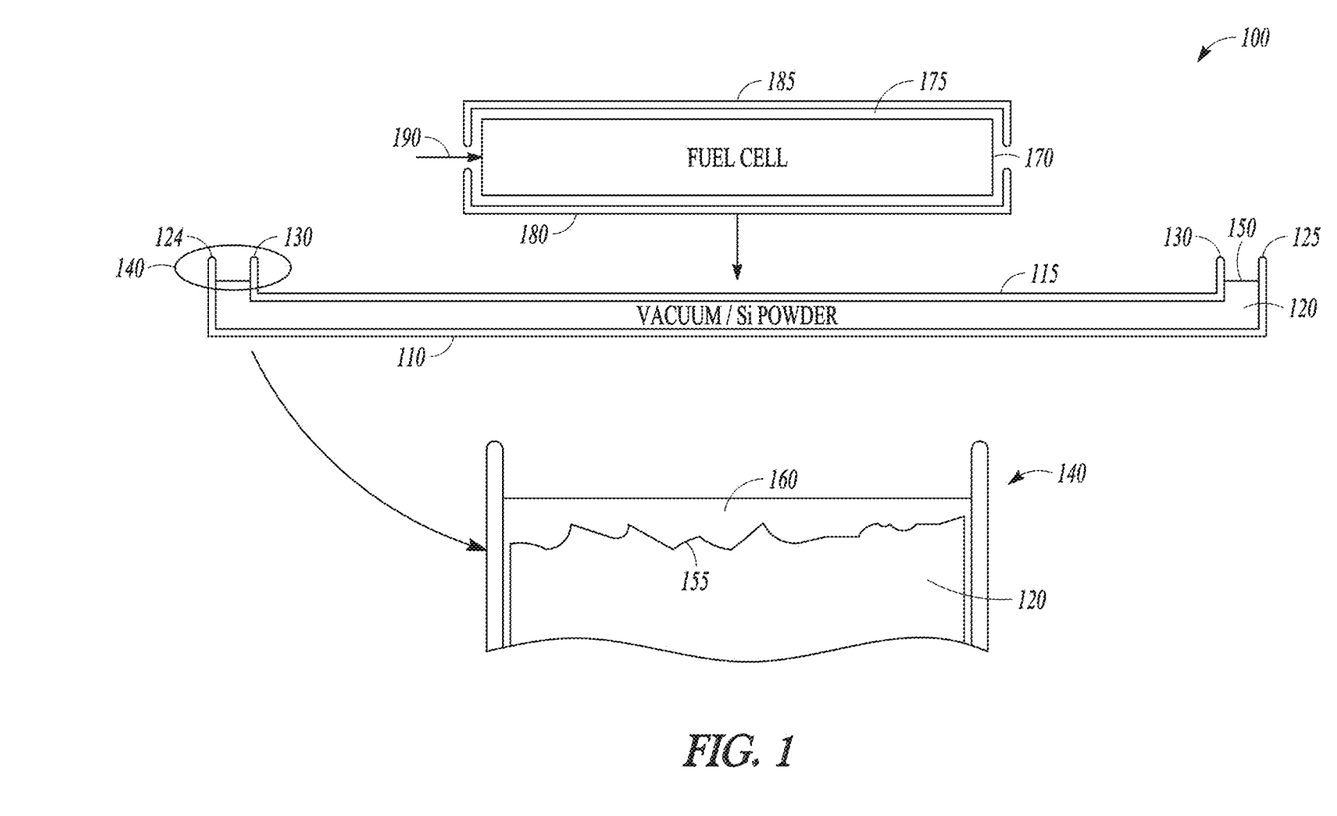
FIG. 1 is a block diagram cross section representation of a thermal insulator for cooling a mobile device according to an example embodiment.

FIG. 1 is a block diagram cross section representation of a thermal insulator 100. The thermal insulator may be formed for an outside plate 110 spaced from an inside plate 115 by a nano-porous material 120. In one embodiment, the plates may be similarly shaped and of slightly different sizes such that the inside plate 115 may nest inside the outside plate 110, creating a space between them that the material 120 occupies. In one embodiment, the space may be fairly uniform between the plates.

In one embodiment, the plates have sides indicated at 125 and 130 that extend away from generally planar portions of the plates. The distance between the sides 125 and 130 may be the same as the distance between the generally planar portions of the plates or may vary in further embodiments. The shape of the generally planar portion of the nested plates may be circular, oval, rectangular, or any other shape desired, such as a polygon. The sides of the plates extend along the entire perimeter of the generally planar portions. In still further embodiments, the generally planar portions of the plates may be curved as opposed to planar. Note that while the distance between the plates and sides of the plates is substantially equal in some embodiments, the distance may be varied in further embodiments where substantially uniform insulation is not needed.

A portion 140 of the sides of the plates is illustrated in further detail in a blown-up view also at 140. The blown-up view of portion 140 illustrates a sealing layer 150 that helps maintain a vacuum within the nano-porous material 120. In one embodiment, the sealing layer 150 includes a layer of a polymer 155, such as parylene or other low thermally conducting material and a metal layer 160 of low thermally conducting metal, such as aluminum or NiCr for example. One or more additional polymer and metal layers arranged in a lamellar fashion may be included in further embodiments.

In one embodiment, the polymer or plastic layer 155 may be between approximately 50 to 200 um thick. The metal layer may be approximately 80 nm thick. The purpose of the sealing layer 150 is to help maintain a vacuum, which may be simply a low pressure as opposed to an absolute vacuum, within the space between the plates. Thus, the thickness of each layer may be varied based on the material used to maintain the vacuum for a desired length of time. Since the metal layer may be more thermally conductive, it is desirable in some embodiments to utilize a metal and a thickness of the metal that minimizes its thermal conductance between the plates. The vacuum provides an area of low thermal conductance, K. As such, it may be varied between absolute and ambient pressure depending on the overall thermal properties desired. Ambient pressure may correspond to atmospheric pressure, which may vary with weather conditions and altitude or depth. In one embodiment, the vacuum is kept between 0 and 100 Pa (Pascal-Newtons/Meter$^2$). Note that the portion 140 shown is provided for illustration of the sealing layer 150 and may not be reflective of the actual shape of the portion 140.

In one embodiment, the material 120 may be a low-density (200-250 kg/m^3) mixture of fumed silica, fiberglass, and silicon carbide (and optionally getter materials to getter gas resulting from outgassing or leakage through the seal) may be pressed into a custom form factor enclosure, such as the two nesting plates 110 and 115. The fumed silica mixture fills the gap between the two nested plates that comprise an enclosure. The mixture is a nano-porous open cell material in one embodiment such that a significant portion of the value occupied by the material is open, as opposed to closed cell materials. A small gap thermally isolates the two plates, this gap is may be coated with a thin, low-thermal conductivity material (or materials) and forms a gas seal as indicated by sealing layer 150.

The space between the plates is evacuated, forming a thermal enclosure with very high thermal resistance between the inner and outer plates. In one embodiment, a device 170, such as a fuel cell-based power generator or smart phone, can be placed within a pocket 175 created by two enclosures 180 and 185, and provide very high thermal resistance between the interior of the pocket and ambient environment. The enclosures may be hinged on one side and may include passages for the active cooling elements described above. In the case of some fuel cells, the two enclosures may not be sealed together, to allow at least oxygen, indicated by arrow 190, from ambient to reach the device 170 for operation of the device. In further embodiments, where access to ambient is not needed, the enclosures may be sealed together by glue, welding, clamping, or other means of attaching the enclosures together.

Gas conductivity for air is a function of gas pressure for different characteristic system size according to an example embodiment. Pore sizes may range from 10 nm to 100 mm in some embodiments. Note that the use of pores in the nanometer range allow operation at higher pressures for a same level of thermal conductivity, which may be easier to achieve and maintain over long periods of time.

In some embodiments, a vapor generating material is included in the material 120. The vapor generating material may have a pressure vs. temperature relationship that modulates the thermal conductance of the vapor in the gap between the enclosure plates, over a desired temperature range.

The vapor generating material may be selected such that vapor pressure is in a desired range (e.g. 100-1000000 Pa for Nano-porous silica) which modulates the thermal conductivity of the vapor over the desired ambient temperature range. Example materials include cyclohexane or water vapor. Different vapor generating materials may be selected depending on the pore size of the silica. Low density, small pore size materials other than silica may also be used if a different thermal resistance value or temperature range is desired. Other materials may include Isopropanol, 1-Butanol, Cyclohexane, Ethanol, and Ethyl acetate. In some embodiments, only one of the example materials or still other materials which generate vapor at a desired temperature is used.

For any particular embodiment, the vapor generating material may be selected on the basis of the desired temperature range of the application and the pore size of the powder. By matching an overall change in pressure for the desired temperature range with the pressure range that creates the largest change in gas conductivity at a given pore size, the design can be optimized for a given application.

A method for forming a thermal enclosure is as follows:

1) Mixing a fumed silica, silicon carbide, fiber glass, and optionally getter material to create a nano-porous material. Note that such mixing is well known in the art as described in at least three papers, such as Dry Powder Processing of Fibrous Fumed Silica Compacts for Thermal Insulation Hiroya Abe,*, w Isami Abe, Kazuyoshi Sato,* and Makio Naito* 2005; Experimental characterisation and evaluation of the thermo-physical properties of expanded perlite-Fumed silica composite for effective vacuum insulation panel (VIP) core M. Alama, H. Singha,*, S. Brunnerb, C. Nazirisa 2015; Performance properties of vacuum insulation panels produced with various filling materials Metin Davraz* and Hilmi C. Bayrakci 2014.

In one embodiment, the mixture is composed of 70-90% fumed silica of approximately 10 um grain size, 1-10% SiC powder of approximately 0.5 um grain size, and 5-15% glass fibers, 1-2 mm×10 um. These are mixed mechanically at low speed (<1000 rpm) for several minutes.

2) Pressing the silica mixture between two plates that comprise the enclosure.

3) In a partial vacuum (<1000 Pa), deposit a conformal coating (e.g. 10-100 um of a polymer such as parylene) to cover the silica in the gap between the plates, forming a gas seal.

4) In a partial vacuum (<1000 Pa), deposit a layer of metal (e.g. 10-1000 nm of Al, NiCr) to cover the parylene.

5) Optionally repeat the polymer/metal coating process to create a multi-layer seal which further reduces permeability (increases lifetime)

The fumed silica mixture in one embodiment may be was 2/88/10% SiC/Fumed Silica/Glass fiber.

6) Optionally, add the vapor generating material to the gap. Alternatively, the vapor generating material could be added during the initial polymer coating process, by filling the deposition chamber with the desired material (provided it doesn't interfere with the deposition process). The vapor may also be introduced via other means, by for example breaking a capsule of the material within the gap, after the seal has been deposited. The capsule may be broken by any means that does not adversely degrade the seal, such as by sound waves or heat.

In some embodiments, the resulting adaptive insulation based on nano-porous silica provides approximately 10 times the thermal resistance of conventional insulation.

The use of a temperature dependent vapor pressure enables modulation of the thermal resistance. The thermal resistance may decrease at high temperatures within the enclosure, allowing heat to be transferred to ambient. At lower temperatures, the thermal resistance may increase.

The use of micro insulation changes the thermal circuit dramatically. The combination of this insulation, along with controlling the emissivity of the device surface, allows for a more manageable total heat load of ~1.6 W. This case is assumed for both the passive and active approaches described below.

In a conventional Vacuum Insulated Panel (VIP), a base of highly-porous silicon foam—used instead of conventional plastic-based foams due to its smaller (nanometer) pore sizes—is sealed and evacuated. This yields a thermal conductivity about an order of magnitude below conventional insulation, and nearly two orders of magnitude below solid plastic.

A novel construction and sealing process allows for miniature vacuum insulation in arbitrary three-dimensional form factor thermal enclosures to adapt to complex custom geometries. The enclosures have been shown to exhibit the expected thermal resistance and vacuum hold time.

Figure 2:
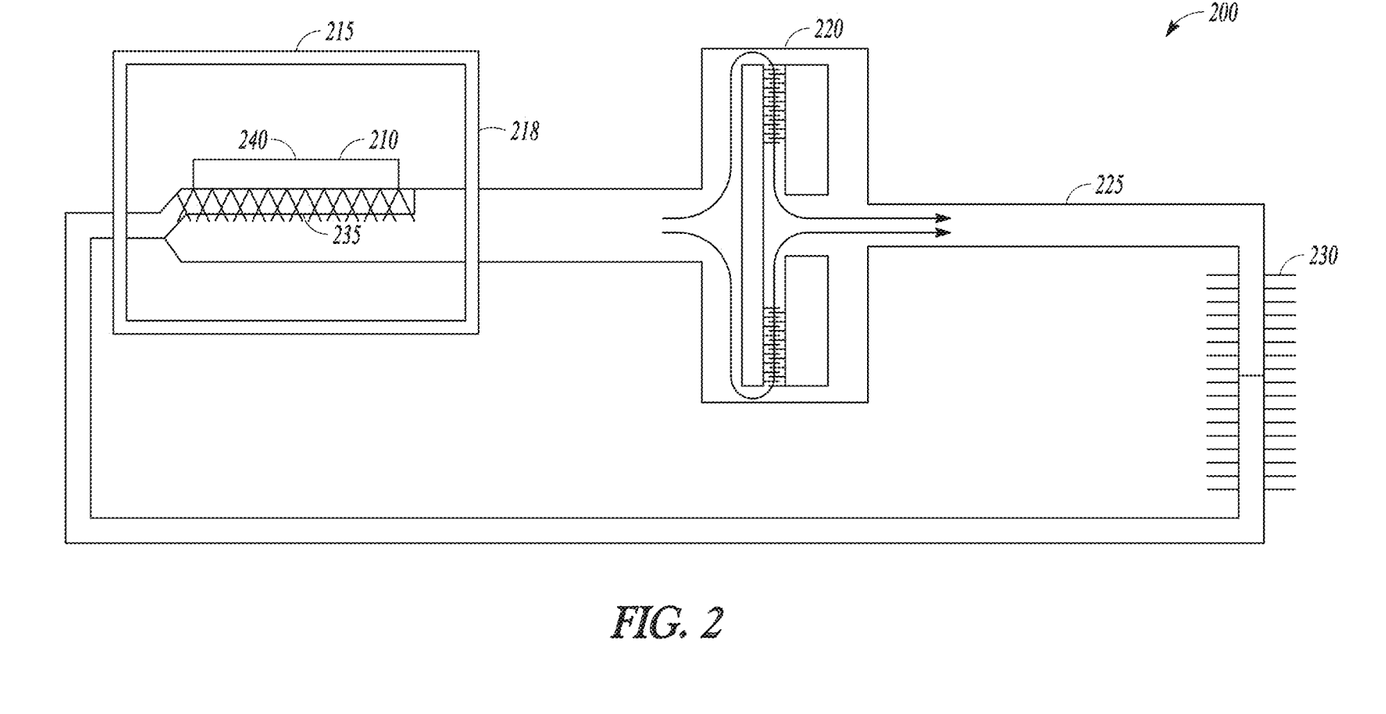
FIG. 2 is a block diagram illustrating a system for cooling a mobile device according to an example embodiment.

FIG. 2 is a block diagram illustrating a system 200 for cooling a mobile device 210. System 200 utilizes a thermal enclosure 215 that at least partially encloses the mobile device 210. In some embodiments, the thermal enclosure comprises a cradle having an opening as described later. The thermal enclosure comprises one or more plates 218, such as the previously described set of plates with insulation. An active heat pump includes a micro compressor 220 for pumping a working fluid through a fluidic loop 225 that includes passages for the working fluid such as a pipe, tube, or other fluid transport mechanism. The fluidic loop 225 includes a condenser or radiator 230 as well as an evaporator 235 that is thermally coupled to the mobile device to remove heat from the mobile device at least by convection. Evaporator 235 may include wicking material to evaporate fluid that is returned to the pump 220 as indicated by arrows through the pump. The fluid may be at least partially in vapor form, and when compressed by the pump 220, returns to liquid form for recirculation in the fluidic loop 225.

The fluidic loop 225 may be at least partially disposed within or coupled to the enclosure 215 to transfer heat out of the enclosure. Given a 15 cc total volume and total mass based on an average smart phone, including the pump and battery, an 8 hour operation is feasible. The pump 220 in one embodiment comprises a micro heat pump is a silicon micromachined turbomolecular pump.

A Reverse Rankine cycle uses FC-43 (MW=670) in one embodiment as working fluid. The liquid pumping against delta P of 18 Torr can be easily accomplished by the capillary action of the wick/evaporator The working fluid, Fluorinert® FC-43, has vapor pressures in the temperature range that falls nicely within the molecular pumping regime. The high molecular mass enables 3200 RPM operation with a 40-stage MEMS turtomolecular pump in one embodiment. The pump may operate at less than 10000 RPM and have between 10 and 1000 stages in some embodiments. COP over 7 can be achieved and only 3-4 cc of rechargeable battery is needed. With the heat pump sized at 10 cc the total volume of less than 15 cc is expected.

For heat rejection, the top surface as well as other exposed surfaces of the condenser 230 are used to radiate and convect heat to the air. White paint may be used to make the surface reflective in visible wavelengths but still emit in infrared. Basic heat transfer calculations show that at least 75% of the back surface of the phone will be effective as a heat rejecting radiator.

While many embodiments necessitate the phone being placed face-down in harsh thermal environments, an optional reflective screen cover 240 may be included in the event that the device is left screen-up in the case of partial enclosures as described in further detail later. Optically transparent IR reflective coatings are well established in literature (e.g., Yoldas 1998). Many transparent plastics will also suffice.

The use of micro insulation for the form factor of the cooling device provides thermal resistance requirements of applications requiring thin insulation and can be made in a wide range of custom form factors. In one embodiment, an improved high-performance thermal enclosure includes a feedback mechanism which modulates its thermal resistance based on ambient temperature. At very low ambient temperatures the thermal resistance is high, while at high ambient temperatures the thermal resistance is low, enabling a device utilizing the enclosure to maintain a temperature which is within the device's operating range.

Various means for removing heat from the thermal enclosure containing a heat generating device may be used. In one embodiment, a micro vacuum system is capable of generating and maintaining <$10^{-6}$ Torr for portable analytical instruments.

Figure 3:
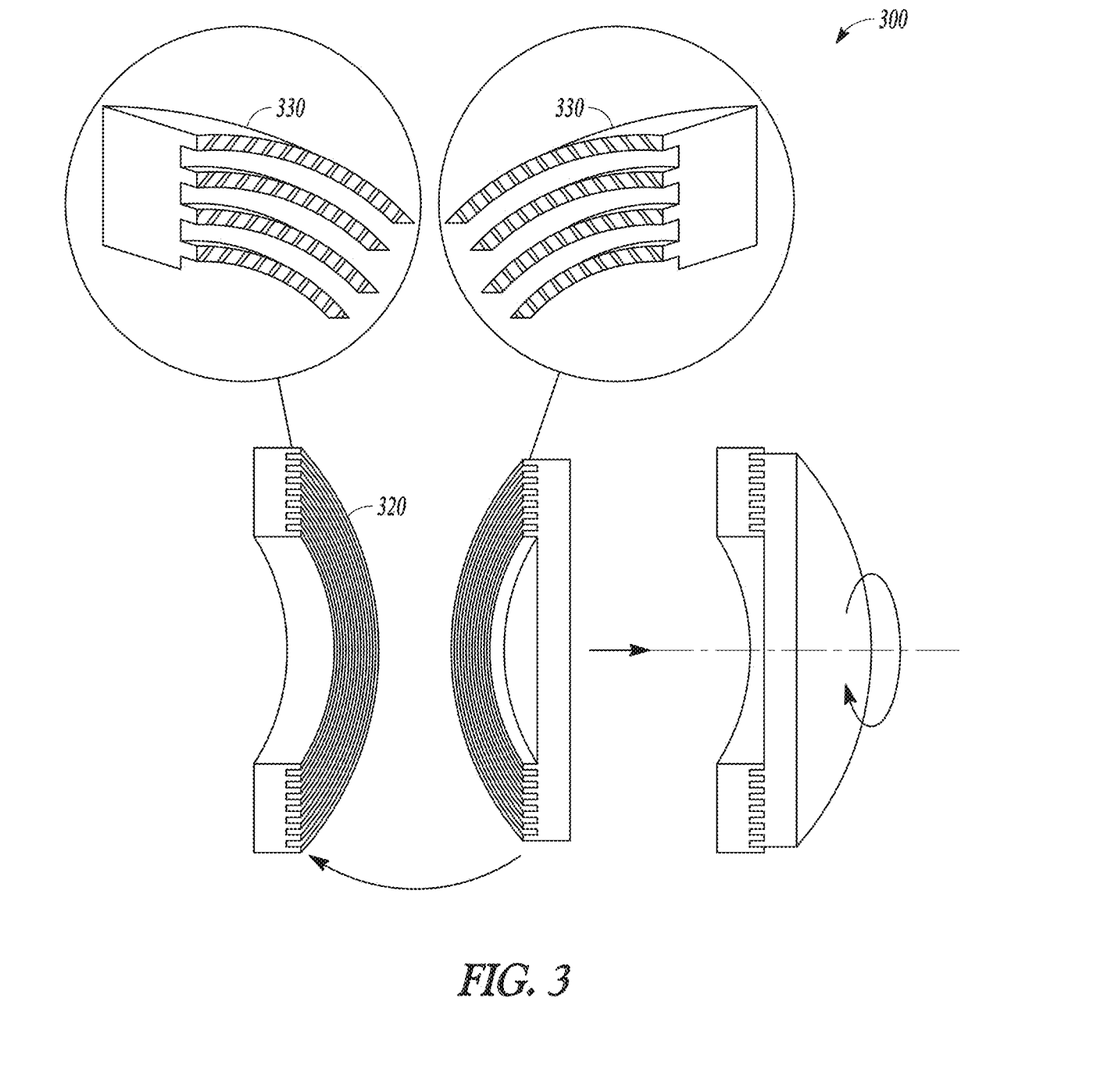
FIG. 3 is a representation of a single stage of a MEMS turbo pump according to an example embodiment.

FIG. 3 is a representation of a single stage of a MEMS turbo pump 300. The pump 300 may have micro blades 330 formed on a ring-like substrate 320. Two stages are shown with corresponding exploded views illustrating the micro blades 330 in further detail. There may be multiple pump stages arranged in a radial direction.

Figure 4:
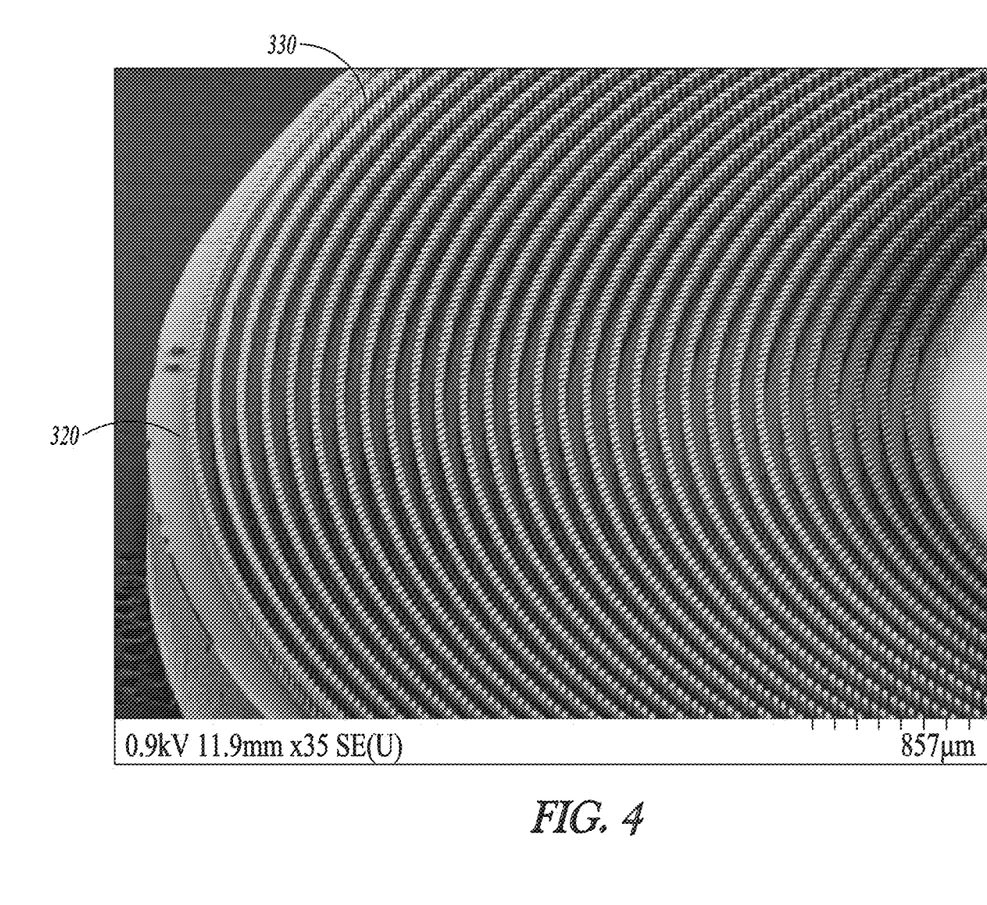
FIG. 4 is a top view representation of a portion of pump of FIG. 3 according to an example embodiment.

FIG. 4 is a top view representation of a portion of pump 300. The dimensions illustrated are for example only and may be modified for various embodiments.

The planar turbomolecular pump 300 is based on monolithic microblades 330 formed by silicon microfabrication on a rotor and stator substrates 320. The tilted blades 330 on the spinning rotor and stationary stator disks 320 in relative motion facilitate momentum transfer in the radial direction where the gas flow can be either inward or outward as desired. The lithographically based silicon microfabrication enables high-density micro blades forming many stages (e.g. 10 to 1000 stages) that is beyond conventional macro turbomolecular pump limitations.

As the result, high compression ratio can be achieved at relatively low tip speed (e.g. 60 m/s). In various embodiments, the pump may operate at less than 10,000 revolutions per minute (RPM). A beneficial consequence of the dimensional scaling is that the micro blade 330 size is comparable to the gas mean free path at much higher pressures, which translates to much higher operating pressure. Such size is beneficial in heat pump applications where the small pump 300 must attain sufficient mass flow while working in the molecular flow regime.

Other fans or pumps may be used in further embodiments to remove heat from the thermal enclosure but may not provide as long a period of maintaining temperatures in the harsh ranges described above.

Stages and tip speed for a compression ratio less than 10 should keep the bulk of the pressure range in the molecular-transitional regime with base pressure of 6-60 Torr. The compression ratio of a molecular pump can be estimated based on $$K = e^{\frac{CNV_b}{V_{th}}}$$

Where $V_b$ is the blade velocity. $V_{th}$ the molecular thermal velocity. N is the number of stages and G is a dimensionless factor determined by the blade geometry, which is about 2.1 for the current blades design.

Figure 5:
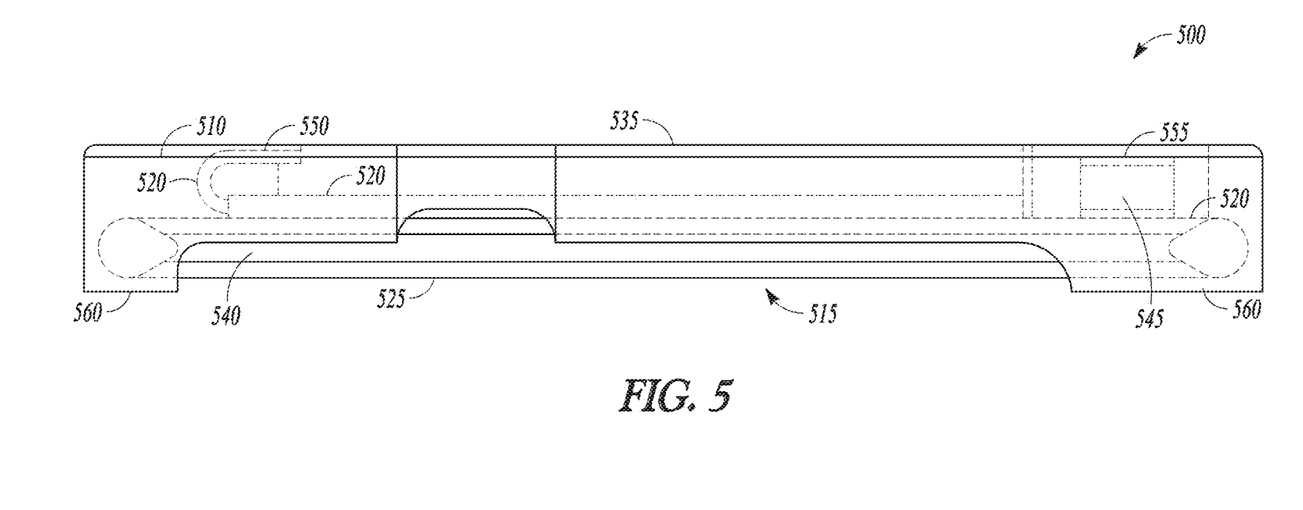
FIG. 5 is a side cross sectional representation of a cooling system according to an example embodiment.
Figure 6:
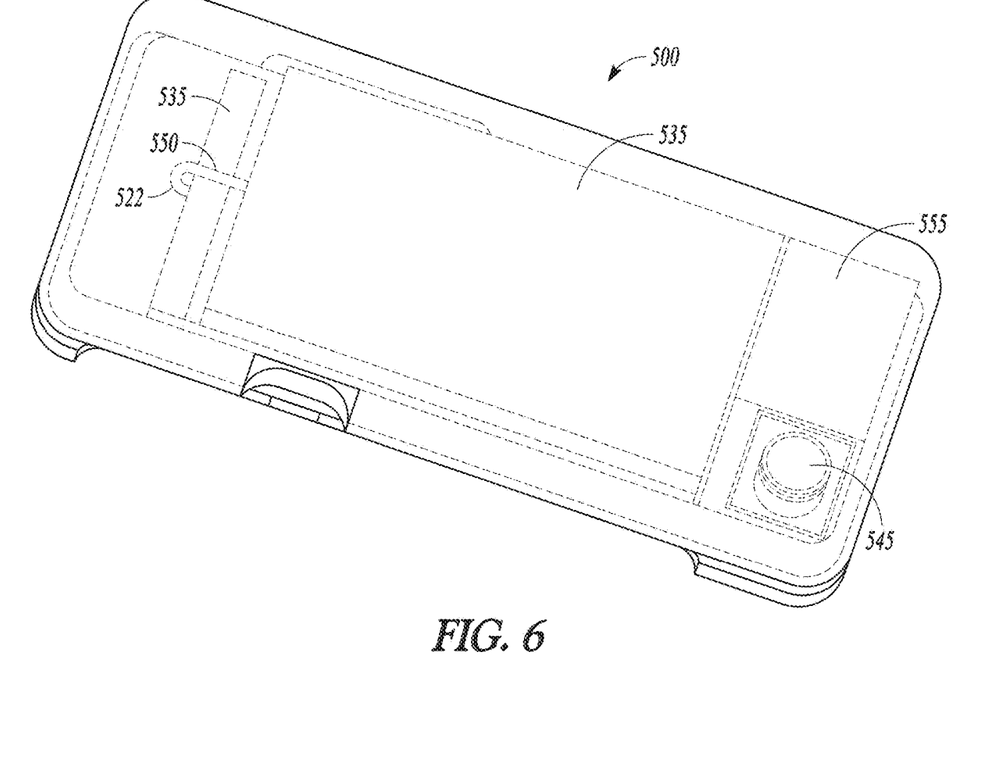
FIG. 6 is a perspective representation of the cooling system of FIG. 5 according to an example embodiment.

FIG. 5 is a side cross sectional representation of a cooling system 500 according to an example embodiment. FIG. 6 is a perspective representation of the cooling system of FIG. 5 having reference numbers consistent with reference numbers in FIG. 5.

The cooling system 500 may be formed as a cradle 510 formed to fit and support a mobile device 515. One or more thermally insulating plates 520 may be used to provide insulation on one or more sides or surfaces of the mobile device. An opening 525 may be positioned to allow insertion and remove of the mobile device 515 form the cradle 510 as well as to provide access to user interfaces, such as touch screens and physical buttons.

In one embodiment, one of the plates 520 is positioned between the mobile device 515 and a condenser 535. The condenser is exposed to atmosphere to radiate heat away from the mobile device while the insulative plate is used to minimize heat transfer back to the mobile device. An evaporator is positioned between the mobile device 515 and the plate 520 to thermally contact and remove heat from the mobile device 515 by use of convection. A pump 545 is used to circulate a working fluid via fluidics 550 forming a cooling loop 552. A battery and electronics to provide power and pump control is indicated generally at 555. In one embodiment, the cradle 510 may include footings or feet 560 formed to provide an air gap between the mobile device and a surface on which the cradle 510 is placed.

A method of using cooling system 500 may include supporting a heat generating mobile device by a thermally coupled evaporator and pumping a working fluid through a fluidic loop comprising a pump, the evaporator, and a condenser to remove heat from the mobile device, wherein the condenser is separated from the mobile device by a thermally insulating plate. The method may utilize one or more thermally insulating plates that comprise a pair of plates having a porous material disposed between the plates that is sealed from ambient at a pressure less than ambient. The pump may be a micromachine turbomolecular multi-stage pump.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. A cooling device comprising;
an evaporator configured to thermally couple to a surface of a mobile device;
a condenser configured to be exposed to atmosphere;
a pump disposed within the cooling device;
a thermally insulating plate disposed between the evaporator and the condenser, wherein the thermally insulating plate comprises a cradle sized to fit a back surface of the mobile device, wherein the cradle includes an opening, wherein the condenser forms a back surface of the cooling device and is configured to be exposed to atmosphere, wherein the thermally insulating plate forms a bottom of the opening, and wherein the opening is configured to provide access to a front interface surface of the mobile device; and
fluidics to couple the evaporator, condenser and pump in a fluidic loop configured to cool the mobile device.

2. The cooling device of claim 1 wherein the plate comprises a pair of plates having a porous material comprising fumed silica disposed between the plates that is sealed from ambient at a pressure less than ambient.

3. The cooling device of claim 1 wherein the pump comprises a micro compressor.

4. The cooling device of claim 3 wherein the micro compressor comprises a silicon micromachine turbomolecular pump.

5. The cooling device of claim 3 wherein the pump has a planar construction with micro blades and multiple pump stages in a radial direction.

6. The cooling device of claim 5 wherein the pump operates at less than 10,000 RPM and has between 10 and 1000 stages.

7. The cooling device of claim 2 wherein the loop a Reverse Rankine cycle structure having a working fluid.

8. The cooling device of claim 7 wherein the working fluid comprises FC-43 (MW=670).

9. The cooling device of claim 1 wherein the plate comprises a partial enclosure having an opening positioned to provide access to user interface portions of the mobile device.

10. A cooling system comprising;
a dual plate enclosure having a fumed silica based porous material disposed between the plates such that the porous material is sealed from ambient at a pressure less than ambient; and
an active cooling thermal loop comprising a condenser and an evaporator, the active cooling thermal loop coupled to a mobile device to remove heat from the mobile device placed in the dual plate enclosure, wherein the dual plate enclosure provides insulation for the mobile device and separates the condenser from the evaporator.

11. The cooling system of claim 10 wherein the cooling device comprises an active heat pump coupled to remove heat from the enclosure.

12. The cooling system of claim 11 wherein the active heat pump comprises a micro compressor.

13. The cooling system of claim 12 wherein the micro compressor comprises a silicon micromachine turbomolecular pump.

14. The cooling system of claim 12 wherein the pump has a planar construction with micro blades and multiple pump stages in a radial direction.

15. The cooling system of claim 14 wherein the pump operates at less than 10,000 RPM and has between 10 and 1000 stages.

16. The cooling system of claim 11 wherein the pump comprises a compressor for a Reverse Rankine cycle structure having a condenser positioned outside the thermal enclosure for receiving a working fluid from the compressor and an evaporator positioned within the enclosure to thermally contact the mobile device within the thermal enclosure.

17. The cooling system of claim 16 wherein FC-43 (MW=670) as the working fluid.

18. A method comprising:
supporting a heat generating mobile device by a thermally coupled evaporator; and
pumping a working fluid through a fluidic loop comprising a pump, the evaporator, and a condenser to remove heat from the mobile device, wherein the condenser is separated from the evaporator by a thermally insulating plate, wherein the thermally insulating plate comprises a cradle sized to fit a back surface of the mobile device, wherein the cradle includes an opening, wherein the condenser forms a back surface of the cooling device and is configured to be exposed to atmosphere, wherein the thermally insulating plate forms a bottom of the opening, and wherein the opening is configured to provide access to a front interface surface of the mobile device.

19. The method of claim 18 wherein the thermally insulating plate comprises a pair of plates having a porous material disposed between the plates that is sealed from ambient at a pressure less than ambient, and wherein the pump comprises a micromachine turbomolecular multi-stage pump.

* * * * *